United States Patent
Ueno et al.

(10) Patent No.: US 6,729,941 B2
(45) Date of Patent: May 4, 2004

(54) PROCESS FOR MANUFACTURING SEMICONDUCTOR WAFER AND SEMICONDUCTOR WAFER

(75) Inventors: Junichi Ueno, Fukushima (JP); Hisashi Masumura, Fukushima (JP); Hiromasa Hashimoto, Fukushima (JP)

(73) Assignee: Shin-Etsu Handotai & Co., Ltd., Tokyo (JP)

( * ) Notice: Subject to any disclaimer, the term of this patent is extended or adjusted under 35 U.S.C. 154(b) by 212 days.

(21) Appl. No.: 09/926,731

(22) PCT Filed: Apr. 6, 2001

(86) PCT No.: PCT/JP01/02984

§ 371 (c)(1),
(2), (4) Date: Dec. 10, 2001

(87) PCT Pub. No.: WO01/78125

PCT Pub. Date: Oct. 18, 2001

(65) Prior Publication Data

US 2002/0137313 A1 Sep. 26, 2002

(30) Foreign Application Priority Data

Apr. 12, 2000 (JP) .......................................... 2000-111182

(51) Int. Cl.[7] .................................................. B24B 7/22
(52) U.S. Cl. ........................................... 451/41; 451/37
(58) Field of Search ............................. 451/41, 28, 36, 451/37, 57; 438/691, 692, 693; 156/645.1

(56) References Cited

U.S. PATENT DOCUMENTS 5,514,245 A * 5/1996 Doan et al. ............... 156/636.1
5,571,373 A   11/1996 Krishna et al.
6,248,002 B1 * 6/2001 Wang et al. ................... 451/41
6,443,807 B1 * 9/2002 Sakai et al. ..................... 451/5

FOREIGN PATENT DOCUMENTS

EP   0555660 A2   8/1993
EP   0684634 A2   11/1995

OTHER PUBLICATIONS

Patent Abstract of Japan, Publication No. 10321566 A, Publication Date Dec. 4, 1998.
Patent Abstract of Japan, Publication No. 11285967 A, Publication Date Oct. 19, 1999.
Patent Abstract of Japan, Publication No. 2001004154 A, Publication Date Feb. 16, 2001.
Patent Abstract of Japan 02250776 A, Publication No. 02250776, Publication Date Oct. 8, 1990.

* cited by examiner

Primary Examiner—Robert A. Rose
(74) Attorney, Agent, or Firm—Arent Fox Kintner Plotkin & Kahn

(57) ABSTRACT

The present invention provides a process for manufacturing a semiconductor wafer capable of effectively reducing unevenness having a wavelength of 0.5 mm or more which remains on a surface of the semiconductor wafer after a first polishing step and improving flatness thereof; and a semiconductor wafer manufactured by the manufacturing process. The manufacturing process comprises: plural polishing steps including a first polishing step and a final polishing step; and a corrective polishing step performed after the first polishing step using a polishing cloth harder than that used in the first polishing step.

16 Claims, 9 Drawing Sheets

(a) W1 (wafer surface after first polishing)

(b) Ws (wafer surface after corrective polishing)

(c) Ws2 (wafer surface after second polishing)

(d) Ws3 (wafer surface after final polishing)

FIG. 3

A first embodiment of a polishing process of the present invention

FIG. 4

A second embodiment of a polishing process of the present invention

Prior art polishing process

FIG. 12

(a) before polishing (b) after polishing

FIG. 13

PROCESS FOR MANUFACTURING SEMICONDUCTOR WAFER AND SEMICONDUCTOR WAFER

TECHNICAL FIELD

The present invention relates to a process for manufacturing a semiconductor wafer capable of effectively reducing unevenness having a relatively long wavelength of 0.5 mm or more that remains on a surface of the semiconductor wafer, for example, a silicon wafer (hereinafter may be simply referred to as a "wafer") after a first polishing step, and improving a surface flatness thereof; and a semiconductor wafer.

BACKGROUND ART

With highly developed integration of devices, even device makers increasingly use polishing machines for film polishing in order to improve uniformity in film thickness and flatness of a film surface after film formation in a device fabrication process.

Figure 12:
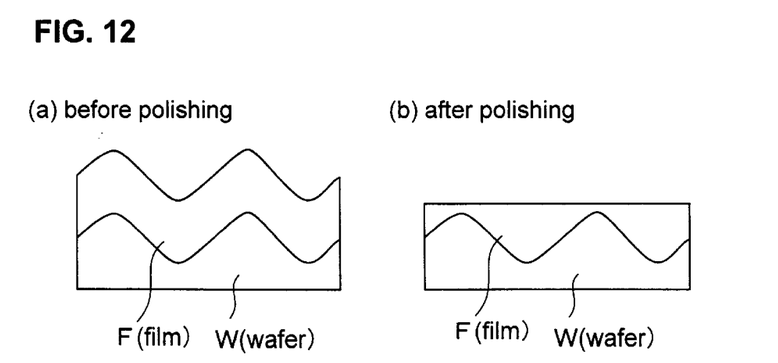
FIG. 12 is a descriptive illustration schematically showing states of a film on a wafer surface in film polishing, wherein (a) shows a state before the polishing and (b) shows a state after the polishing.

As shown in FIG. 12, however, when surface unevenness having a wavelength of 0.5 mm or more and a relatively large P-V value (width of from a peak to a valley of the unevenness: Peak to Valley) of the order of 0.1 $\mu$m are present on a surface of a wafer W prior to formation of a film F thereon, because thickness of the film F is of the order of 0.2 $\mu$m, although flatness of a surface of the film F is improved by polishing it, uniformity in thickness of the remaining film F after the polishing is greatly affected by the unevenness on the surface of the wafer W.

Therefore, in order to increase a product yield in a device fabrication process, it is necessary to reduce the unevenness on the surface of the wafer W. However, as a matter of fact, there frequently remains unevenness having a relatively long wavelength of 0.5 mm or more on the surface of the wafer W, whereby it is more likely to raise a problem of non-uniformity in thickness of the remaining film in the film polishing process performed by the device makers.

Figure 8:
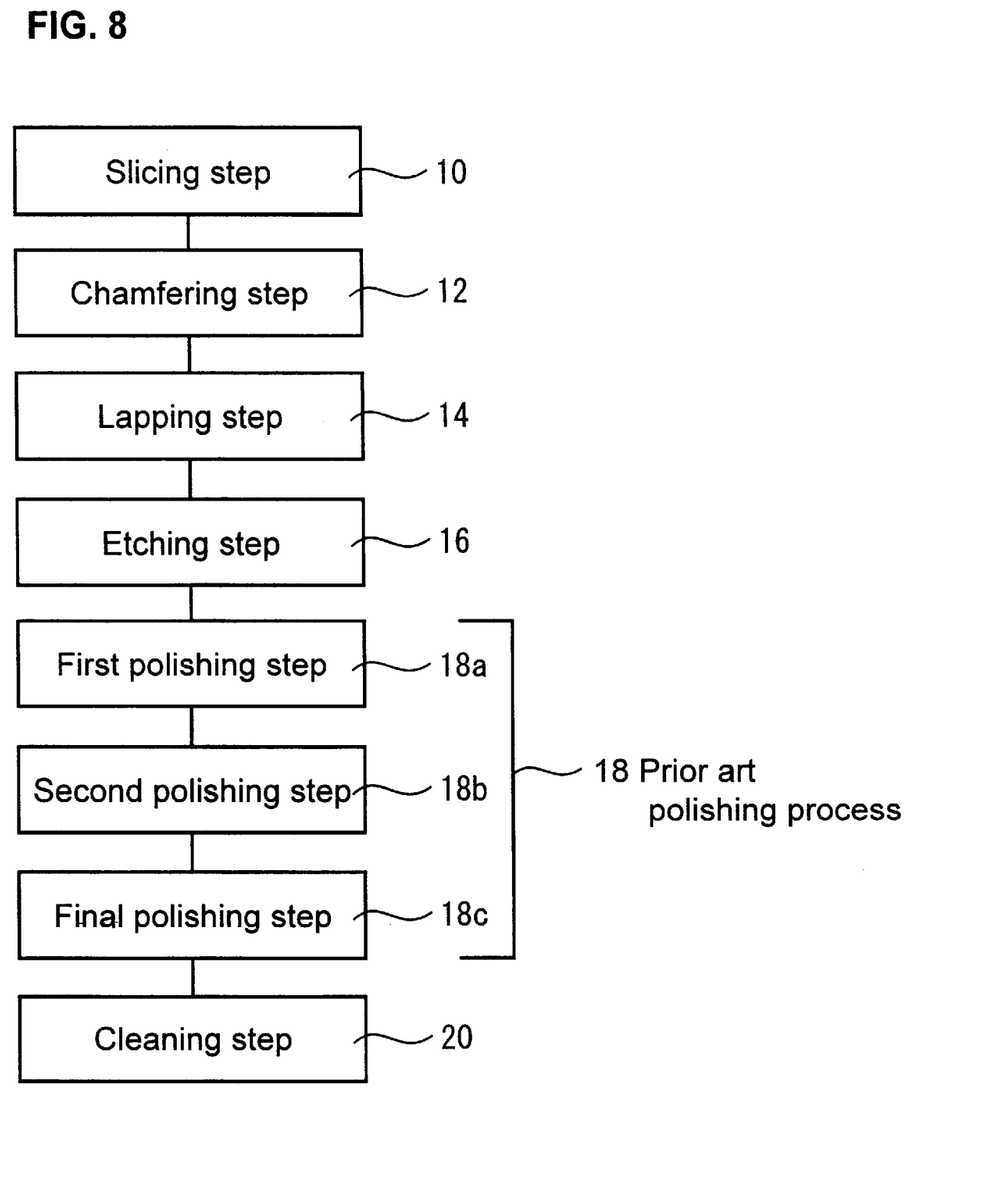
FIG. 8 is a flow chart showing an example of step sequence of a prior art process for manufacturing a semiconductor wafer.

A prior art manufacturing process for a semiconductor wafer, for example, a silicon wafer comprises, as shown in FIG. 8, a slicing step 10, a chamfering step 12, a lapping step 14, an etching step 16, a polishing process 18, and a cleaning step 20.

Figure 13:
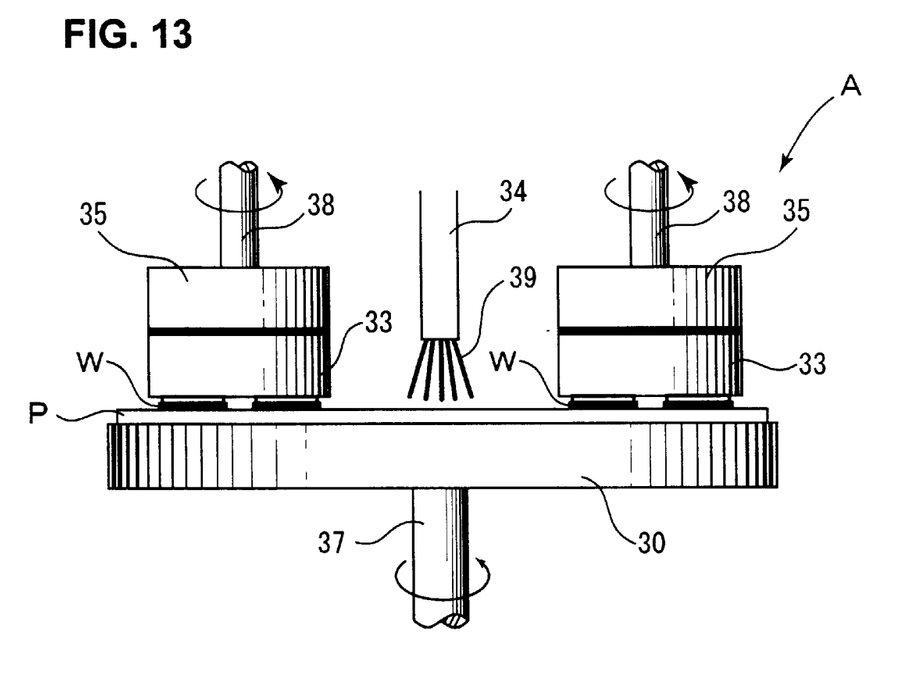
FIG. 13 is a descriptive side view showing a construction of a polishing apparatus.

In the polishing process 18, a wafer W is polished using a polishing apparatus A as shown in FIG. 13. The polishing apparatus A has a polishing turn table 30 which is rotated at a prescribed rotational speed by a rotary shaft 37. A polishing cloth P is fixed on an upper surface of the polishing turn table 30. Numeral reference 33 indicates a work holding plate and the work holding plate 30 is rotated by a rotary shaft 38 with a top weight 35 interposed therebetween. One or more wafers W are held on a bottom surface of the work holding plate 33 by means of an adhesive or the like and pressed onto a surface of the polishing cloth P in the state held on the under surface of the work holding plate 33, while a polishing agent solution (slurry) 39 is supplied concurrently onto the polishing cloth P through a polishing agent supply tube 34 from a polishing agent supply apparatus (not shown) at a prescribed rate, thus the wafer or wafers being polished through rubbing of a to-be-polished surface of the wafer or wafers against the surface of the polishing cloth P with the polishing agent solution 19 interposed therebetween.

The polishing process 18 includes usually plural steps of a rough polishing step for planarization and a final polishing step for improvement of surface roughness and removal of polishing scratches. FIG. 8 shows an example of a 3 stage polishing process composed of: a first polishing step 18a where a polishing cloth having a relatively high hardness is used for achievement of higher flatness of a silicon wafer; a second polishing step 18b where a polishing cloth softer than that used in the first polishing step 18a is used for removal of roughness, deformation and cloudiness on a surface of a wafer produced in the first polishing step; and a final polishing step 18c.

In the rough polishing (including the first polishing and the second polishing in the example of FIG. 8), there has generally been used a relatively hard polishing cloth wherein a non-woven fabric such as a foamed urethane sheet or a foamed polyester sheet is impregnated with urethane resins, and in the final polishing, there has generally been used a suede-like polishing cloth wherein foamed urethane resins are formed on a base non-woven fabric. As a polishing agent, there is mainly used a dispersion liquid prepared by dispersing fumed silica, colloidal silica or the like in an alkaline solution.

Figure 9:
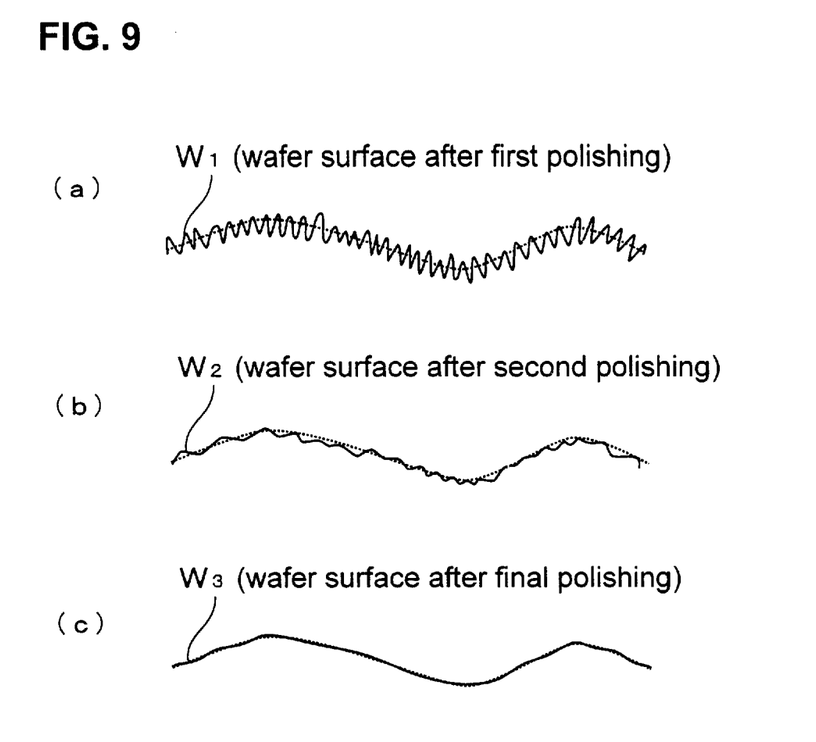
FIG. 9 is a descriptive illustration showing variations in a surface state of a wafer in each polishing step of a prior art process.
Figure 10:
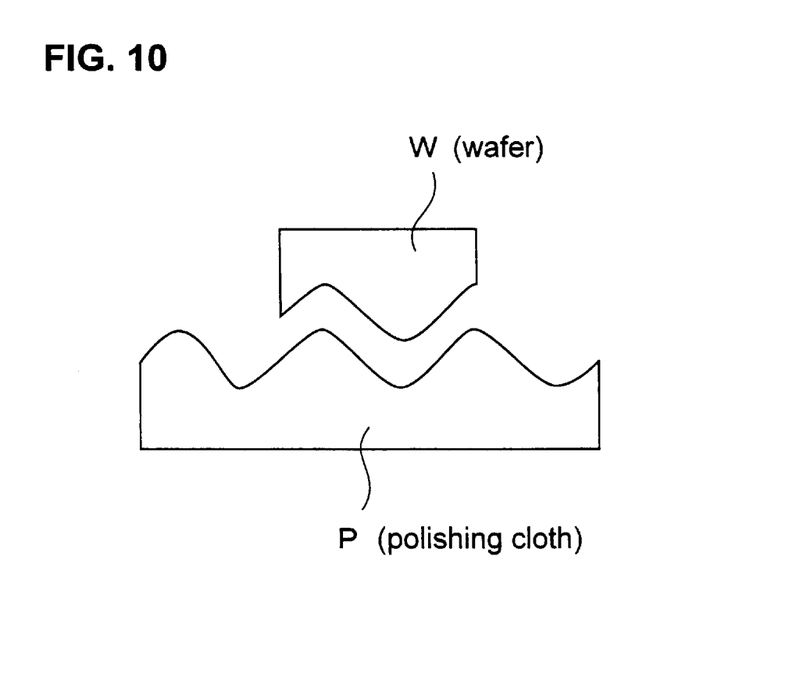
FIG. 10 is a descriptive illustration schematically showing a polishing state of a wafer in a first polishing step.
Figure 11:
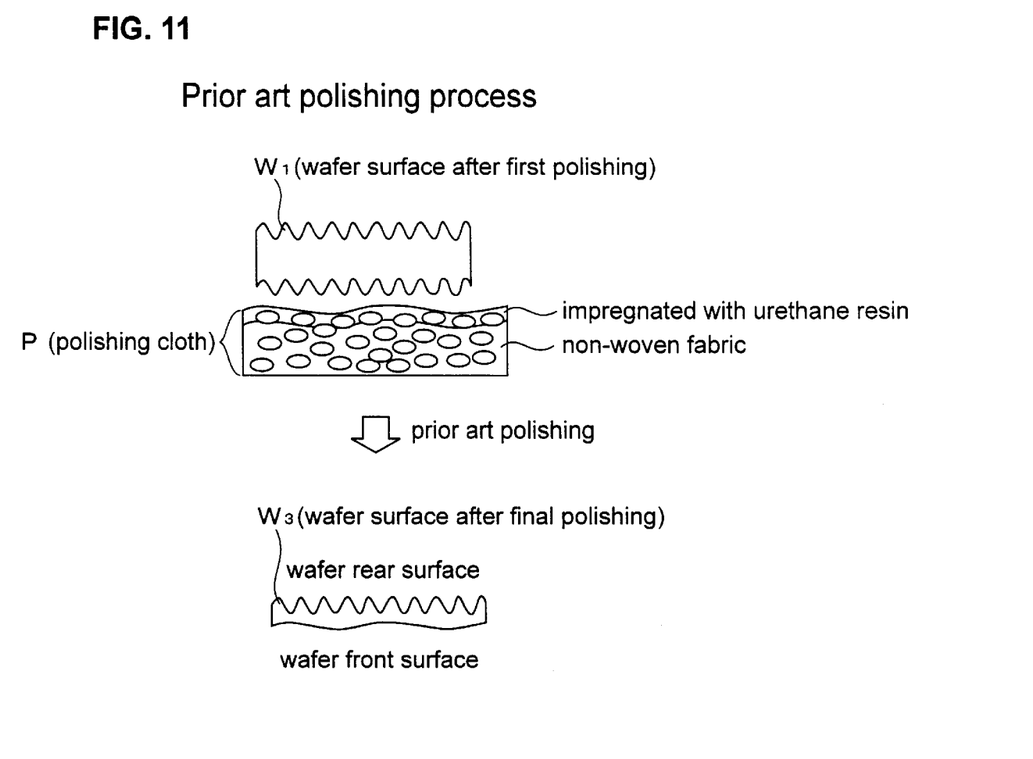
FIG. 11 is a descriptive illustration showing surface states of a wafer after first polishing and final polishing in a prior art polishing process.

Amounts of polishing stock removal in the polishing steps 18a to 18c are 5 $\mu$m or more in the first polishing step 18a, 0.1 $\mu$m or more in the second polishing step 18b and 0.01 $\mu$m or more in the final polishing step 18c, respectively. Surface unevenness having a long wavelength of 0.5 mm or more, which can be a problem, is determined in the first polishing step 18a where the hardest polishing cloth is used (FIGS. 9, 10 and 11). FIGS. 9 and 11 show variations in a surface state of a wafer in respective polishing steps and FIG. 10 schematically shows an influence (transfer) of surface undulations of a polishing cloth especially used in the first polishing step on a shape of the wafer. In the second polishing step, the amount of the polishing stock removal is very small and a polishing cloth in use is soft; hence in the present state the above-described unevenness can not be corrected sufficiently.

That is, as shown in FIGS. 9 and 11, (a) on a wafer $W_1$ after the first polishing, there comes into being a combined state of relatively large surface unevenness having a wavelength of 0.5 mm or more, for example, of the order of from 0.5 mm to 10 mm, and a P-V value of the order of from tens to hundreds of nm, and fine surface unevenness having a wavelength of 0.5 mm or less, for example, of the order of from 0.01 to 0.10 mm, and a P-V value of the order of from tens to hundreds of nm; (b) on a wafer $W_2$ after the second polishing, a P-V value of surface unevenness having a relatively fine wavelength, for example, of from 0.01 to 0.10 mm is improved and (c) on a wafer $W_3$ after the final polishing, a P-V value of surface unevenness having a wavelength from 0.01 to 0.10 mm is further improved. However, even after the second polishing and the final polishing, there still remains relatively large surface unevenness having a wavelength of 0.5 mm or more, for example, of the order of from 0.5 mm to 10 mm, and a P-V value ranging from tens to hundreds of nm.

In this way, in the prior art polishing steps, when performing the plural polishing steps, hardness of a polishing cloth used in the first polishing step is the highest and in subsequent steps, polishing cloths hardness of which is lowered in serial sequence of the steps are used, but as stated above there remains a problem that the surface unevenness having a wavelength of 0.5 mm or more can not be corrected.

DISCLOSURE OF THE INVENTION

In order to reduce a P-V value of unevenness having a relatively long wavelength, for example, of 0.5 mm or more in the first polishing, a polishing cloth having higher and uniform hardness should be used, but using such a polishing cloth in the first polishing, an amount of the polishing stock removal becomes large; thus the polishing cloth is loaded and scratches are produced on a wafer surface so that it is practically difficult to use such a polishing cloth.

In view of an amount of polishing stock removal, such a polishing step as the prior art one is performed, but in this case as described above, surface unevenness having a relatively long wavelength remains unchanged. The presence of such surface unevenness can be confirmed by an evaluation where a wafer surface is divided with a specific area, for example, an area 0.5 mm square, a P-V value in each area is confirmed and it is evaluated to what extent the wafer surface is occupied with a specific P-V value. In the prior art polishing step, for example, when the above evaluation is performed in an area 0.5 mm square, there was present even a wafer with a P-V value of the order of 20 nm. In company with a progressive request for a wafer with good flatness, however, even the presence of a P-V value of the order of 20 nm is a problem; there is requested improvement on the above problems.

It is accordingly an object of the present invention to provide a process for manufacturing a semiconductor wafer capable of effectively reducing unevenness having a wavelength of 0.5 mm or more which remains on a surface of the semiconductor wafer after a first polishing step, and improving flatness thereof; and a semiconductor wafer.

Then, the inventors have conducted a serious research for the purpose to develop a new polishing process by which the above surface unevenness is reduced. As a result of the research, there is newly found the fact that after a first polishing step when a wafer is additionally polished with stock removal of the order of from 0.3 to 3 μm using a polishing cloth which is uniform in hardness and harder than that used for the first polishing step, the polishing cloth is not loaded and there can be obtained a polished wafer which is small in the above-described unevenness and good in flatness.

A further research has been continued to reveal the additional fact that after the additional polishing step the wafer is as conventionally subjected to, for example, the conventional second and final polishing for improving unevenness having a wavelength of 0.5 mm or less and there can be obtained a polished wafer without cloudiness, the present invention having been completed on the basis of the above finding.

In order to solve the above problem, a process for manufacturing a semiconductor wafer of the present invention comprises: plural polishing steps including a first polishing step and a final polishing step; and a corrective polishing step performed after the first polishing step using a polishing cloth harder than that used in the first polishing step.

Hardness of a polishing cloth used in the first polishing step is preferably in the range of from 73 to 86 in Asker-C scale and hardness of a polishing cloth used in the corrective polishing cloth is preferably in the range of from 80 to 98 in Asker-C scale. An Asker-C hardness is a value measured with a C type Asker rubber hardness meter, a kind of a spring hardness tester.

Unevenness having a wavelength of 0.5 mm or more on a surface of a semiconductor wafer remaining after the first polishing step can be reduced in the corrective polishing step.

A polishing cloth used in the corrective polishing step is preferably one whose surface in contact with a wafer is of high hardness. For example, the following polishing cloths are preferable in the aspect of hardness: a polishing cloth prepared by further impregnating a polishing cloth made of a polyester non-woven fabric impregnated with urethane resins used in a prior art first polishing, with much of urethane resins or the like to increase its surface hardness; and a polishing cloth made of chemical reaction foamed materials, for example, urethane resins, especially, made of non-foamed urethane resins having small bubbles. While no specific limitation is imposed on the polishing cloth, it is preferably a high hardness polishing cloth with uniform hardness over its surface and low generation of scratches.

While a process of the present invention may be applied to polishing processes of plural polishing steps, among them, the most effective one is the way where in a 3 stage polishing process including a first polishing step, a second polishing step and a final polishing step, after the first polishing step, the corrective polishing step is performed. If required, the corrective polishing step may be substituted for the second polishing step.

The first polishing step in the present invention is a polishing step in which a relatively high hardness polishing cloth is used for the purpose of higher flatness of a silicon wafer, and includes not only a single stage but also plural stages.

In a semiconductor wafer of the present invention, when a semiconductor wafer surface is evaluated in an area 0.5 mm square, an occupancy rate of the area where a P-V value is 15 nm or more in the semiconductor wafer surface is less than 0.01%.

When the above semiconductor wafer surface is evaluated in an area 2.0 mm square, an occupancy rate of the area where a P-V value is 20 nm or more in the semiconductor wafer surface is preferably less than 0.15%.

When the above semiconductor wafer surface is evaluated in an area 10.0 mm square, an occupancy rate of the area where a P-V value is 50 nm or more in the semiconductor wafer surface is more preferably less than 0.15%.

Function

The greatest feature of a process of the present invention is in that a polishing step for reducing surface unevenness having a wavelength of 0.5 mm or more, that is, a corrective polishing step is newly added after a first polishing step. By using a polishing cloth harder than that used in the first polishing step, for example, a non-foamed urethane resin polishing cloth, in the corrective polishing step subsequent to the first polishing step, unvenness having a wavelength of 0.5 mm or more on a surface of the polishing cloth is decreased; unevenness having a wavelength of 0.5 mm or more on a surface of a wafer produced prior to the first polishing step or during the first polishing step is improved.

Furthermore, since a polishing cloth used in the corrective polishing step is of a hard type, a sag in an outer peripheral edge portion of the wafer depending on a polishing stock removal is decreased to realize improved flatness polishing. For example, in a comparison of unevenness of wafer surfaces in an area 0.5 mm square, it has been confirmed that unevenness of a P-V value of 20 nm or more is not observed in a wafer polished according to a prior art polishing process; unevenness of a P-V value of 16 nm or more is not observed in a wafer polished according to a polishing process of the present invention and surface flatness of the polished wafer is also improved by introduction of a high hardness polishing cloth.

BEST MODE FOR CARRYING OUT THE INVENTION

Description will be given of embodiments of the present invention with reference to FIGS. 1 to 4 of the accompanying drawings and it is needless to say that the embodiments are shown by way of illustration and various modification or variations can be performed as far as not departing from the technical concept of the present invention.

Figure 1:
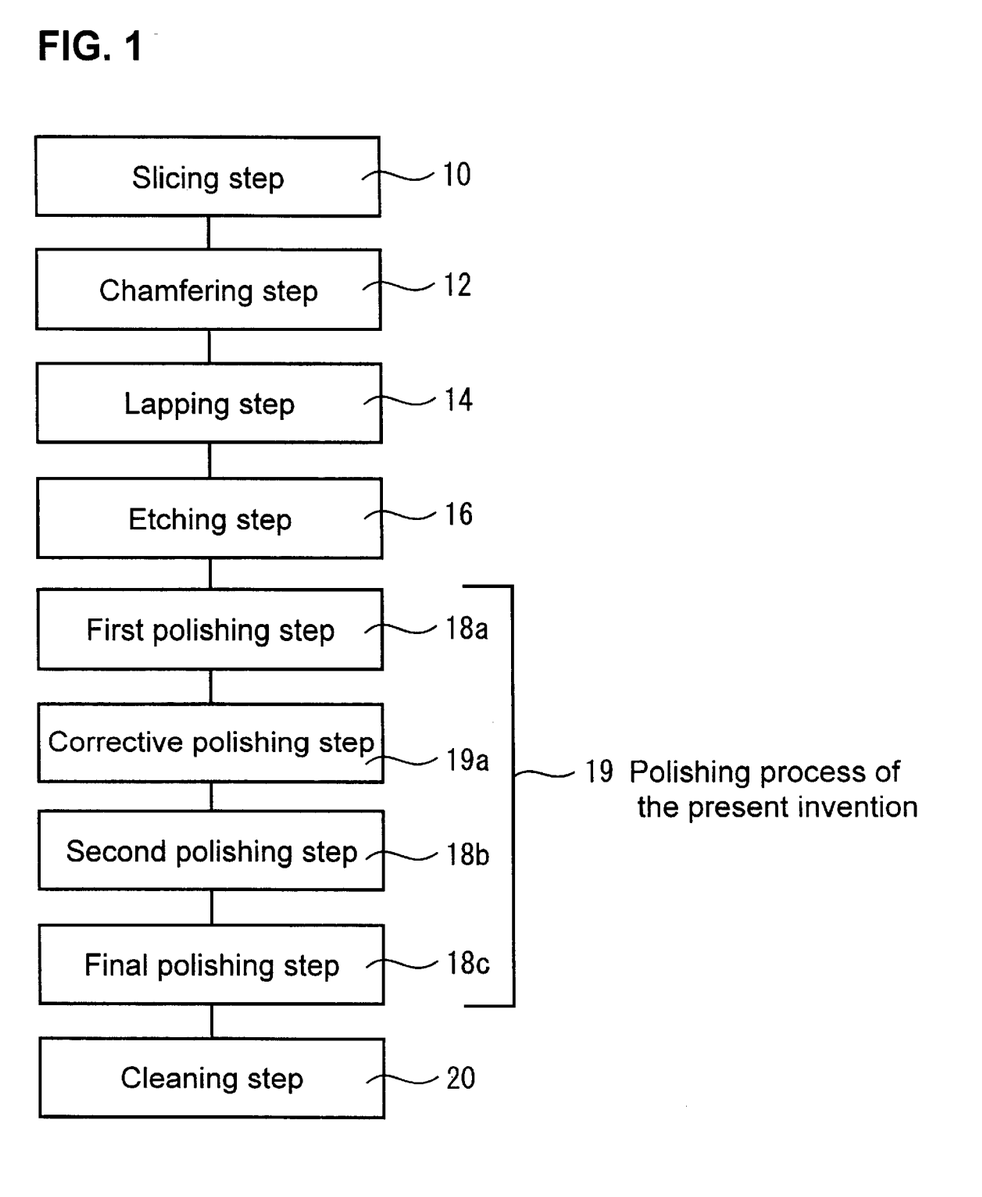
FIG. 1 is a flow chart showing an embodiment of step sequence of a process for manufacturing a semiconductor wafer of the present invention.

A process for manufacturing a semiconductor wafer of the present invention is composed of, as shown in FIG. 1, a slicing step 10, a chamfering step 12, a lapping step 14, an etching step 16, a polishing process 19 and a cleaning step 20, almost similar to the prior art process shown in FIG. 8.

A process of the present invention is different from the prior art process in that the polishing process 19 unique to the present invention is substituted for the prior art polishing process 18. In the polishing process 19 of the present invention, a corrective polishing step 19a is newly added after the prior art first polishing step 18a. The corrective step 19a is to be followed by the second polishing step 18b and the final polishing step 18c.

A feature of the corrective polishing step 19a newly adopted in a process of the present invention is in that there is used a polishing cloth harder than a polishing cloth used in the first polishing step 18a. A difference in hardness between the polishing cloths in the first polishing and the corrective polishing is only such that the latter is harder than the former without no other specific limitation, and the latter is effectively harder than the former by 10 to 40% in hardness. To explain more concretely, since hardness of the polishing cloth used in the first polishing step 18a is usually in the range of from 73 to 86 in Asker-C scale and in a compression ratio range of from 2 to 5%, hardness of the polishing cloth in the corrective polishing step 19a is preferably in the range of from 80 to 98 in Asker-C scale and in a compression ration of from 0.5% to 2%. At this time, an amount of polishing stock removal in the corrective polishing may be determined fittingly according to a state of surface unevenness after the first polishing. However, an amount of polishing stock removal in the corrective polishing is to be set in the range of the order of from 0.3 to 3 $\mu$m, almost independently of an amount of polishing stock removal in the first polishing. This is because a P-V value of surface unevenness having a wavelength of 0.5 $\mu$m or more is of the order of hundreds of nm; therefore polishing of stock removal of 0.3 $\mu$m or more is sufficient to approximately correct the surface unevenness. Although increase in an amount of polishing stock removal leads to further improvement of the surface unevenness, use of a polishing cloth of relatively high hardness in the present corrective polishing leads to the fact that a polishing cloth is apt to be loaded, whereby there is a tendency to reduce a life time of the polishing cloth. Therefore, an amount of polishing stock removal is preferably restricted to the order of 3 $\mu$m. If polishing is more preferably performed in the range of from 0.5 to 2 $\mu$m in an amount of polishing stock removal, surface unevenness having a relatively long wavelength and a large P-V value remaining after the first polishing can be perfectly removed, with the result that a lifetime of the polishing cloth is preferably improved.

Figure 2:
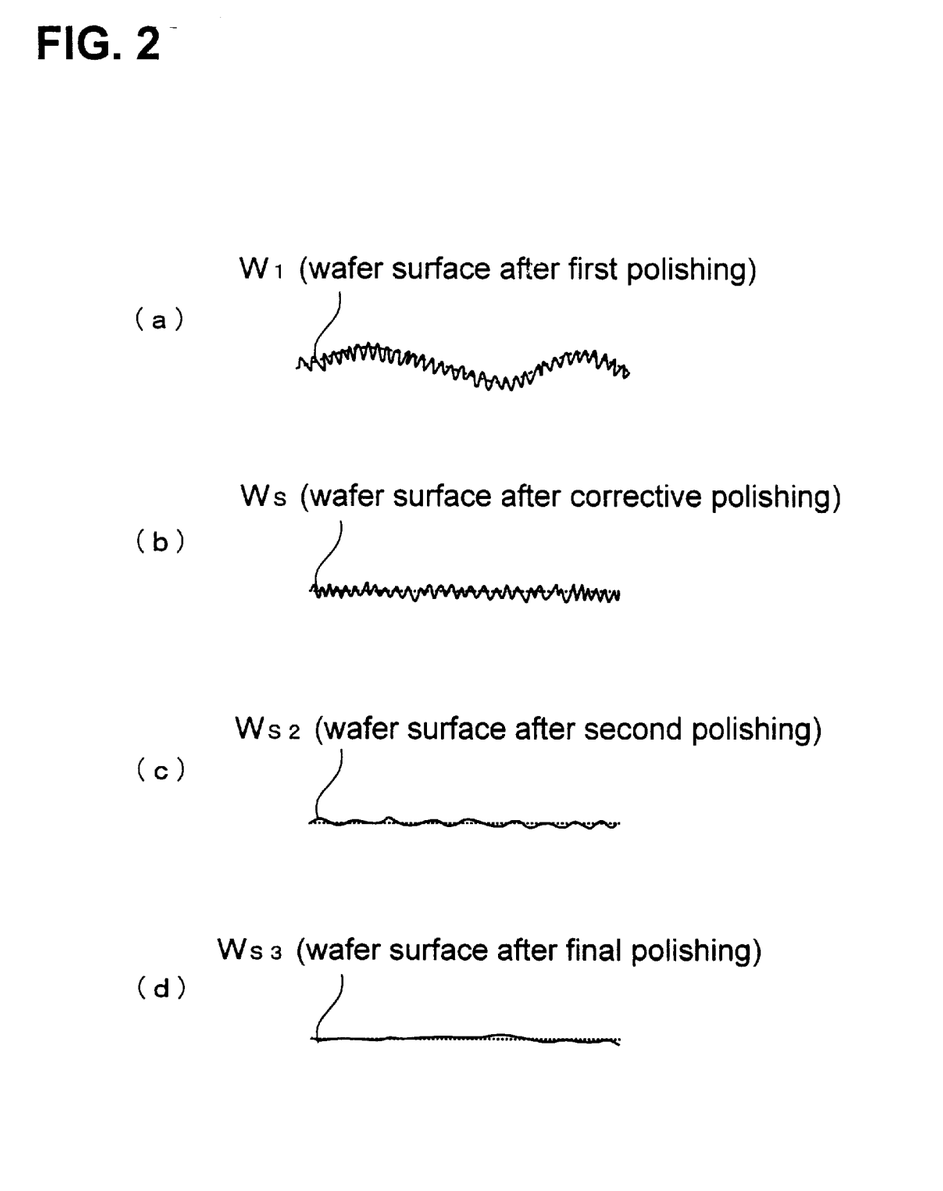
FIG. 2 is a descriptive illustration showing variations in a surface state of a wafer in each polishing step of a process of the present invention.

When polishing in the polishing process 19 of the present invention is performed on a wafer, unevenness having a wavelength of 0.5 mm or more on a surface of the wafer is effectively reduced. That is, as shown in FIG. 2, (a) on a wafer $W_1$ after the first polishing, there is present a combined state of surface unevenness having a relatively large wavelength of 0.5 mm or more, for example, of the order of from 0.5 mm to 10 mm and a P-V value of from tens to hundreds of nm, and surface unevenness having a fine wavelength of 0.5 mm or less, for example, of the order of from 0.01 to 0.10 mm and a P-V value of the order of from tens to hundreds of nm. (b) On a wafer Ws having been corrected by the corrective polishing, there has been improved and almost perfectly removed by the corrective polishing surface unevenness having a relatively large wavelength of 0.5 mm or more, for example, of the order of from 0.5 mm to 10 mm and a P-V value from tens to hundreds of nm, and there is surface unevenness having a wavelength of 0.5 mm or less, for example, of from 0.01 to 0.10 mm and a P-V value of about 70 nm. That is, in the corrective polishing, surface unevenness of a wavelength of from 0.01 to 0.10 mm remains almost unchanged. (c) On a wafer $W_{S2}$ after the second polishing, there is surface unevenness having a wavelength of from 0.01 to 0.10 mm and a P-V value of about 50 nm, and (d) on a wafer $W_{S3}$ after the final polishing, there is surface unevenness having a wavelength from 0.01 to 0.10 mm and a further improved P-V value of 20 nm or less.

Figure 3:
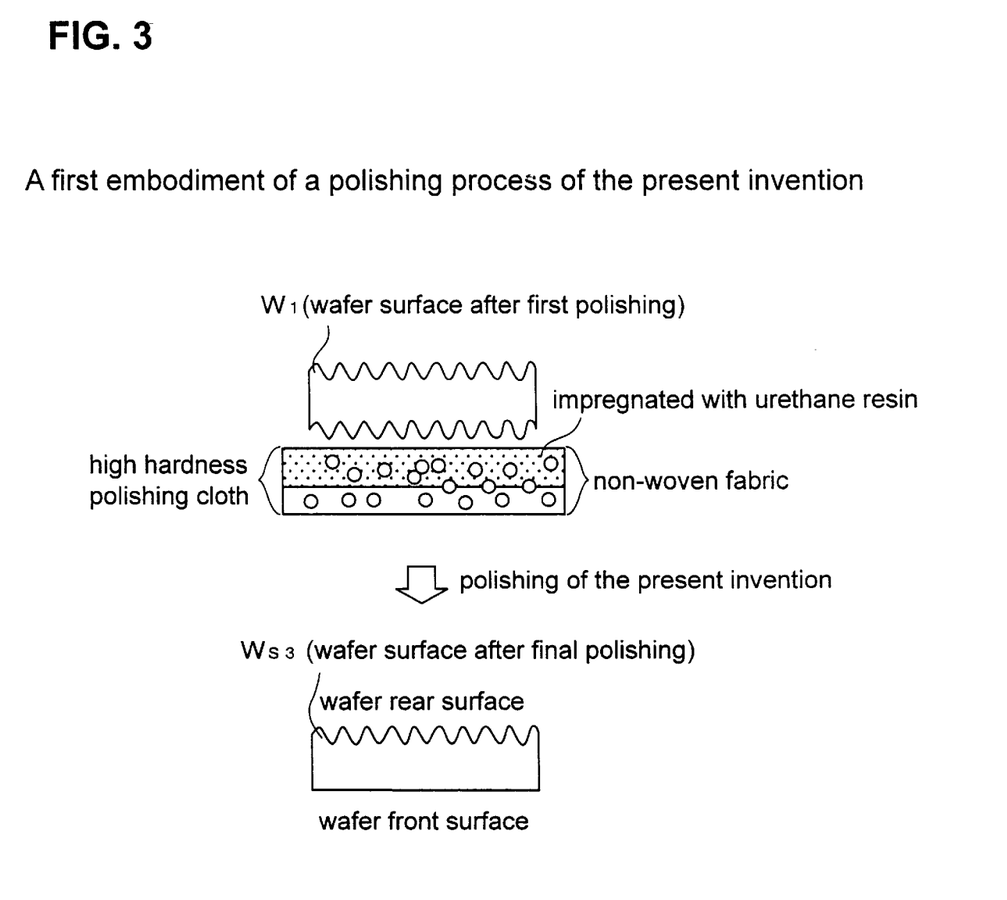
FIG. 3 is a descriptive illustration showing an embodiment of a corrective polishing step in a process of the present invention.
Figure 4:
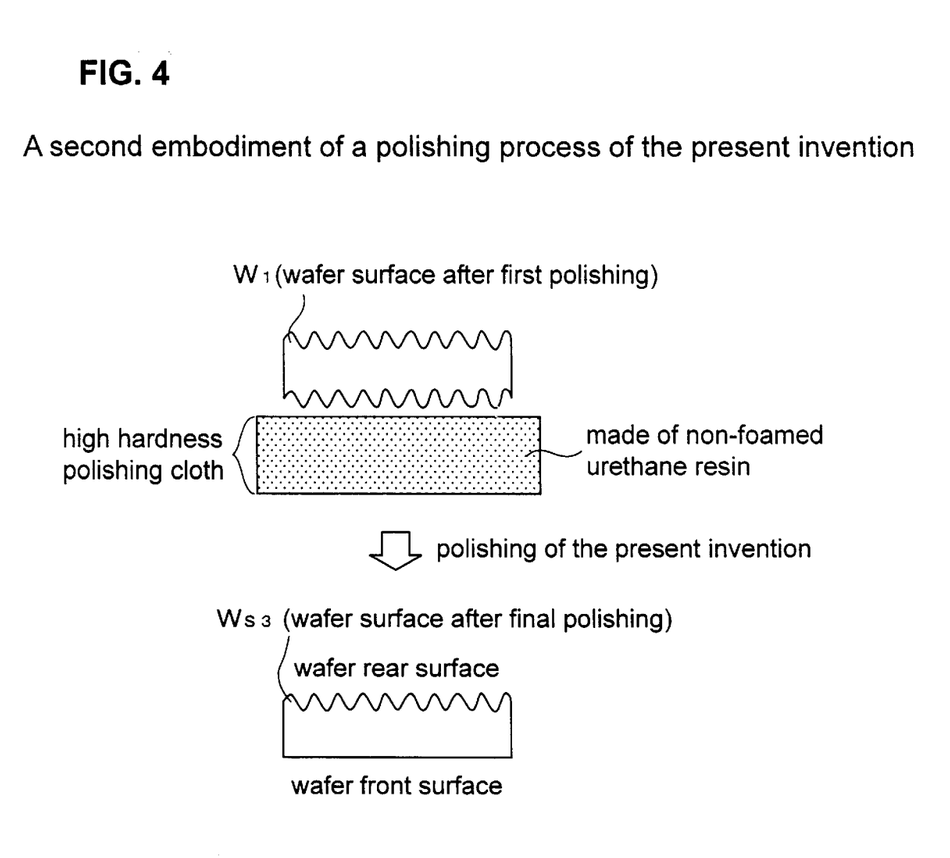
FIG. 4 is a descriptive illustration showing another embodiment of a corrective polishing step in a process of the present invention.

As materials of a polishing cloth for the corrective polishing step 19a, there is preferably used, as shown in FIG. 3, a non-woven fabric impregnated with much of synthetic resins, for example, a polyester non-woven fabric impregnated with much of urethane resins, or, as shown in FIG. 4, a chemical reaction foamed sheet, for example, a non-foamed urethane resin sheet having almost no bubbles.

Note that while in the above embodiment there is shown the case where the second polishing step 18b is performed, if the second polishing step 18b can be replaced with the corrective polishing step 19b, the second polishing step 18b may be omitted.

A semiconductor wafer of the present invention is obtained by polishing the semiconductor wafer using a polishing process of the above-described present invention, wherein surface unevenness having a wavelength of 0.5 mm or more is greatly reduced in comparison with a prior art wafer.

The characteristic structure of the semiconductor wafer of the present invention, as explained in the description of Examples described later, are clearly defined as follows in a relationship between a P-V value and an occupancy rate in an area of a prescribed size square on a surface of the semiconductor wafer.

That is, a semiconductor wafer of the present invention is such that when the surface thereof is evaluated in an area 0.5 mm square, an occupancy rate of the area where a P-V value is 15 nm or more in the surface is less than 0.01%, in other words, substantially zero.

Further, when the surface thereof is evaluated in an area 2.0 mm square, an occupancy rate of the area where a P-V value is 20 nm or more in the surface is preferably less than 0.15%.

Furthermore, when the surface thereof is evaluated in an area 10.0 mm square, an occupancy rate of the area where a P-V value is 50 nm or more in the surface is preferably less than 0.15%.

EXAMPLES

While the present invention will be detailed in a more concrete manner taking up an example and a comparative example below, it is needless to say that the examples are shown by way of illustration only but should not be construed by way of limitation.

Example 1

As specimen wafers there are used wafers prepared by slicing an ingot of 200 mm in diameter, followed by chamfering, lapping and etching.
Polishing step: first polishing→corrective polishing→second polishing→final polishing.
Polishing conditions for the first polishing:
Polishing cloth: a polyester non-woven fabric sheet impregnated with urethane resins; hardness of 80 in Asker-C scale; a compression ratio of 3.7%,
Slurry: colloidal silica,
Polishing load: 200 to 400 g/cm$^2$,
Peripheral speed: 20 to 30 m/min, and
Amount of polishing stock removal: 6 to 10 μm.
Polishing conditions for the corrective polishing:
Polishing cloth: a non-foamed urethane resin sheet; hardness of 80 to 98 in Asker-C scale; a compression ratio of 0.5 to 2%,
Slurry: colloidal silica,
Polishing load: 200 to 350 g/cm$^2$,
Peripheral speed: 40 to 45 m/min, and
Amount of polishing stock removal: 1 to 1.5 μm.
Polishing conditions for the second polishing:
Polishing cloth: a polyester non-woven fabric impregnated with urethane resins; hardness of 50 to 70 in Asker-C scale; a compression ratio of 5 to 15%,
Slurry: colloidal silica,
Polishing load: 200 to 350 g/cm$^2$,
Peripheral speed: 30 to 35 m/min, and
Amount of polishing stock removal: 0.5 to 1 μm.
Polishing conditions for the final polishing:
Polishing cloth: a suede sheet; hardness of 55 to 65 in Asker-C scale; a compression ratio of 3 to 7%,
Slurry: colloidal silica,
Polishing load: 80 to 120 g/cm$^2$,
Peripheral speed: 35 to 40 m/min, and
Amount of polishing stock removal: 0.05 μm.

According to the above polishing conditions, polishing of the wafers was performed. This polishing was performed using a polishing apparatus of batch processing and a water fixing system with a template assembly accompanying a wafer flying out preventive blank member on a backing film of a compression ratio ranging from 2 to 2.5%.

The specimen wafers were polished under the above polishing conditions. P-V values were confirmed on a surface of each of polished wafers. The confirmation was performed in the case where a wafer surface is divided with an area each 10 mm square, 2 mm square and 0.5 mm square, and a P-V value in each area was measured to confirm an occupancy rate, that is, to what extent the wafer surface is occupied with a specific P-V value. The used measuring apparatus was WIS CR-83 (made by ADE Corporation).

Figure 5:
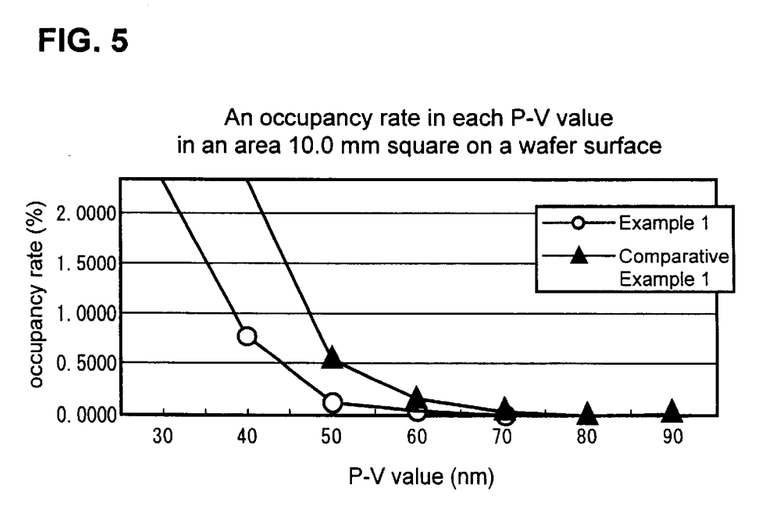
FIG. 5 is a graph showing a relationship between a P-V value and an occupancy rate in an area 10.00 mm square on a semiconductor wafer surface in each of Example 1 and Comparative Example 1.
Figure 6:
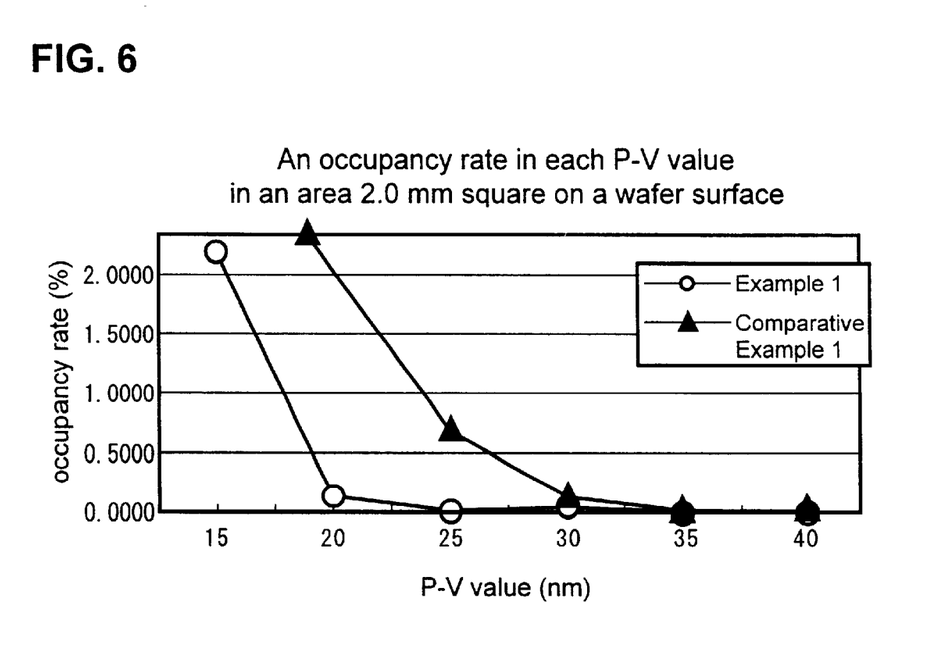
FIG. 6 is a graph showing a relationship between a P-V value and an occupancy rate in an area 2.0 mm square on a semiconductor wafer surface in each of Example 1 and Comparative Example 1.
Figure 7:
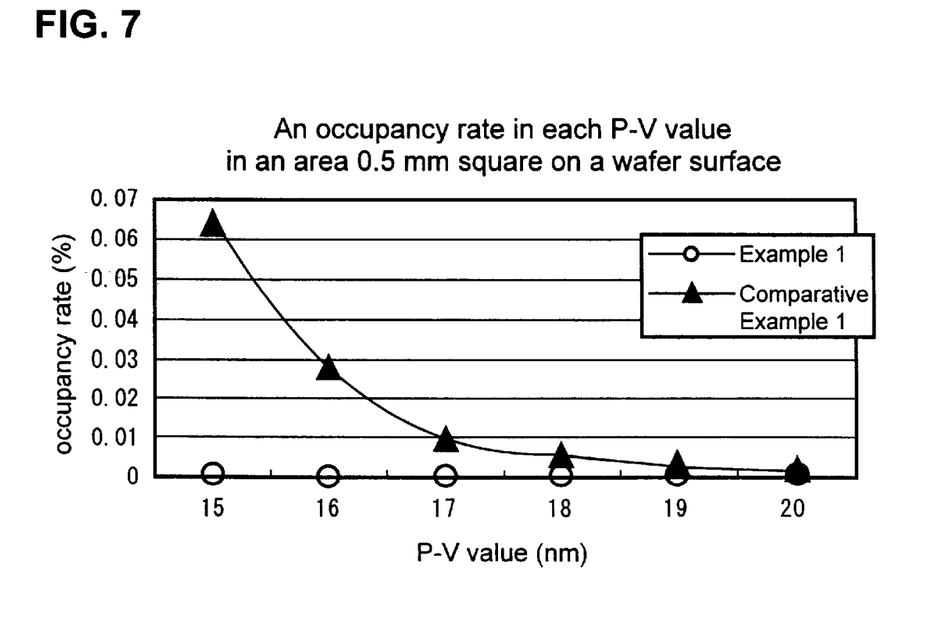
FIG. 7 is a graph showing a relationship between a P-V value and an occupancy rate in an area 0.5 mm square on a semiconductor wafer surface in each of Example 1 and Comparative Example 1.

There are shown in FIG. 5 the results evaluated in each area 10 mm square, in FIG. 6 the results evaluated in each area 2 mm square, and in FIG. 7 the results evaluated in each area 0.5 mm square, respectively.

Comparative Example 1

Specimen wafers were polished in the conditions similar to Example 1 with the exception that the corrective polishing was not performed, that is, under prior art conditions. P-V values of the polished wafers were measured in a manner similar to Example 1 and the results are shown in FIGS. 5 to 7 together with those of Example 1.

FIG. 5 shows the results where a wafer surface is divided with an area 10 mm square and P-V values ranging from 40 nm to 90 nm are confirmed at 10 nm intervals. By evaluation in an area 10 mm square, it is confirmed that in Comparative Example 1, P-V values up to the order of 80 nm are confirmed and P-V values of 50 nm are present in 0.5% or more, while in Example 1, P-V values of 70 nm or more are not found and P-V values of 50 nm are improved to the order of 0.1%.

FIG. 6 shows the results where a wafer surface is divided with an area 2 mm square and P-V values ranging from 15 nm to 40 nm are confirmed at 5 nm intervals. By evaluation in an area 2 mm square, it is confirmed that in Comparative Example 1, P-V values up to the order of 35 nm are confirmed and P-V values of 20 nm are present in 2.0% or more, while in Example 1, P-V values of 25 nm or more are not found and P-V values of 20 nm are improved to the order of 0.01%.

FIG. 7 shows the results where a wafer surface is divided with an area 0.5 mm square and P-V values ranging from 15 nm to 20 nm are confirmed at 1 nm intervals. By evaluation in an area 0.5 mm square, it is found that in Comparative Example 1, even P-V values up to the order ranging from 15 nm to 20 nm are present, while in Example 1, P-V values in this range are not almost confirmed and these P-V values are greatly improved.

Thus according to the present invention, it is found that a P-V value of surface unevenness having a wavelength of 0.5 mm or more is improved. Furthermore, in Example 1, all of the polished wafers were evaluated in terms of flatness with SFQR (Site Front Least-sQuares Range) (cell size: 26×33 mm) to show 0.18 μm or less, while in Comparative Example 1, up to the order of 0.20 μm. Furthermore, the wafers were evaluated with SBIR (Site Back-side Ideal Range) (cell size: 26×33 mm) to show 40 μm or less in Example 1, while in Comparative Example, up to 0.45 μm. From the above observations, it was confirmed that flatness of the polished wafers was also improved according to a polishing method of the present invention.

Capability of Exploitation in Industry

According to the present invention, as described above, there can be effectively reduced unevenness having a wavelength of 0.5 mm or more on a surface of a wafer which remains after a first polishing step and a wafer can be manufactured with improved flatness and no cloudiness. Therefore, it is possible to supply wafers with high flatness and reduced surface unevenness so that there is settled a problem of non-uniformity in thickness of the remaining film in a film polishing process performed by the device makers.

What is claimed is:

1. A process for manufacturing a semiconductor wafer comprising: plural polishing steps including a first polishing step and a final polishing step; and a corrective polishing step performed after the first polishing step using a polishing cloth harder than that used in the first polishing step.

2. A process according to claim 1, wherein hardness of the polishing cloth used in the first polishing step is in the range of from 73 to 86 in Asker-C scale and hardness of the polishing cloth used in the corrective polishing cloth is in the range of from 80 to 98 in Asker C scale.

3. A process according to claim 1, wherein unevenness having a wavelength of 0.5 mm or more on a surface of the semiconductor wafer remaining after the first polishing step is reduced in the corrective polishing step.

4. A process according to claim 1, wherein the polishing cloth used in the corrective polishing step is a high hardness polishing cloth prepared by impregnating non-woven fabrics with urethane resins or a polishing cloth of chemical reaction foamed materials.

5. A process according to claim 1, wherein the plural polishing steps include the first polishing step, a second polishing step and the final polishing step, the corrective polishing step being added after the first polishing step.

6. A process according to claim 2, wherein unevenness having a wavelength of 0.5 mm or more on a surface of the semiconductor wafer remaining after the first polishing step is reduced in the corrective polishing step.

7. A process according to claim 2, wherein the polishing cloth used in the corrective polishing step is a high hardness polishing cloth prepared by impregnating non-woven fabrics with urethane resins or a polishing cloth of chemical reaction foamed materials.

8. A process according to claim 3, wherein the polishing cloth used in the corrective polishing step is a high hardness polishing cloth prepared by impregnating non-woven fabrics with urethane resins or a polishing cloth of chemical reaction foamed materials.

9. A process according to claim 6, wherein the polishing cloth used in the corrective polishing step is a high hardness polishing cloth prepared by impregnating non-woven fabrics with urethane resins or a polishing cloth of chemical reaction foamed materials.

10. A process according to claim 2, wherein the plural polishing steps include the first polishing step, a second polishing step and the final polishing step, the corrective polishing step being added after the first polishing step.

11. A process according to claim 3, wherein the plural polishing steps include the first polishing step, a second polishing step and the final polishing step, the corrective polishing step being added after the first polishing step.

12. A process according to claim 4, wherein the plural polishing steps include the first polishing step, a second polishing step and the final polishing step, the corrective polishing step being added after the first polishing step.

13. A process according to claim 6, wherein the plural polishing steps include the first polishing step, a second polishing step and the final polishing step, the corrective polishing step being added after the first polishing step.

14. A process according to claim 7, wherein the plural polishing steps include the first polishing step, a second polishing step and the final polishing step, the corrective polishing step being added after the first polishing step.

15. A process according to claim 8, wherein the plural polishing steps include the first polishing step, a second polishing step and the final polishing step, the corrective polishing step being added after the first polishing step.

16. A process according to claim 9, wherein the plural polishing steps include the first polishing step, a second polishing step and the final polishing step, the corrective polishing step being added after the first polishing step.

* * * * *